United States Patent [19]

Buttar

[11] Patent Number: 5,325,337
[45] Date of Patent: Jun. 28, 1994

[54] RANDOM ACCESS MEMORIES (RAM) AND MORE PARTICULARLY TO SELF-TIMED RAMS

[75] Inventor: Alistair G. Buttar, Tannay, Switzerland

[73] Assignee: Motorola, Inc., Schaumburg, Ill.

[21] Appl. No.: 933,540

[22] Filed: Aug. 24, 1992

[30] Foreign Application Priority Data

Sep. 12, 1991 [GB] United Kingdom ............... 9119525

[51] Int. Cl.[5] .................................................. G11C 7/02
[52] U.S. Cl. ............................... 365/210; 365/189.08; 365/201; 365/203; 365/195
[58] Field of Search ................... 365/210, 189.08, 201, 365/203, 195, 196, 155, 154, 189.05, 189.01

[56] References Cited

U.S. PATENT DOCUMENTS 4,627,032 12/1986 Kolwicz et al. ..................... 365/233

Primary Examiner—Eugene R. LaRoche
Assistant Examiner—Huan Hoang
Attorney, Agent, or Firm—Michael D. Bingham; Robert D. Atkins

[57] ABSTRACT

A self-timed RAM (2) having a two-phase read and write operating cycles which comprise a precharge phase and a discharge phase and which is clocked by a clock signal. The self-timed RAM comprises control means (18, 20, 24, 22, 26, 28, 30) for initiating and controlling the precharge phase followed by the discharge phase in response to a first transition of the clock signal. The self-timed RAM further comprises logic means (30, ERRFLG) which determines when either phase of the two-phase operating cycle has not been completed before the next first transition of the clock signal and in response thereto activates an error indicating means (ERRFLG) to indicate that an error may have occurred during the RAM operating cycle. A controlling system of the RAM can then determine that an error may have occurred during the RAM operating cycle by checking the error indicating means (ERRFLG).

10 Claims, 3 Drawing Sheets

RANDOM ACCESS MEMORIES (RAM) AND MORE PARTICULARLY TO SELF-TIMED RAMS

FIELD OF THE INVENTION

This invention relates to Random Access Memories (RAM) and more particularly to self-timed RAMs.

BACKGROUND OF THE INVENTION

For a RAM to function correctly, two primary requirements must be fulfilled: during a read operation stored data must not be inadvertently altered due to a malfunction either in the RAM controlling system or in the RAM itself; and after a write operation, the RAM must indicate to the controlling system if the operation was completed successfully or not. In many applications, insufficient time is available to verify each individual write operation of a given data word in a given memory location, with a subsequent read of the data in the same memory location.

The correct functioning of RAM can be disturbed by electrical noise and this is particularly true for a RAM operating in a noisy environment, such as inside a television set or beside an engine.

The electrical noise may be produced by several different sources: for example, the clock duty cycle may change significantly from the ideal case of 50%, the clock frequency may change, parasitic spikes may appear on the clock signal and the power supply voltage may drop momentarily. In television sets for example, such affects can arise from the electrical discharge phenomenon known as 'flashover' and may also arise from parasitic coupling in the Integrated Circuit (IC) packaging including the RAM or from other parts of the same IC. The electrical noise can disturb the operation of the RAM to the extent that write and read operations are not completed.

In conventional RAM, correct operation is usually dependent on the quality of the incoming clock signal. In particular, the duration of the clock HIGH and LOW periods must be sufficiently long to ensure problem-free operation. The generation of electrical noise due to for example a drop in the power supply voltage, or ground bounce resulting from parasitic coupling or inductive coupling will affect the clock signal which can cause the RAM cycle period to slow down to the extent that information cannot be read or written sufficiently quickly so that the read and write operations are not completed.

A known solution which attempts to overcome these problems is to use a self-timing function in a RAM. Self-timed RAMs are well known in the art and are particularly useful in high speed computers (i.e. with cache memory) where the goal is to minimise the overall system cycle time.

The read and write cycles in the self-timed RAM are both triggered by either a rising or falling clock edge. Thus, a departure of the clock duty cycle from 50% does not disturb the function of the RAM, assuming the clock frequency is within the specified limits. This is because once the RAM cycle has been initiated by a rising or falling clock edge, it continues until completion independently of the falling or rising clock edge respectively.

Thus, electrical noise due to changes in the clock duty cycle do not disturb the function of the self-timed RAM. However, the function of self-timed RAM can still be affected by electrical noise arising due to drops in power supply voltage and/or clock frequency changes and as discussed above such noise can cause read and write cycles to be incompleted.

One way to check whether a read or write cycle has been completed is to verify all of the memory locations to check if they contain the correct data. However, a complete check of the RAM requires a significant period of time which is unacceptable in some applications, such as in high speed computers and in systems which function in real-time such as television sets.

Accordingly, the invention seeks to provide an improved self-timed RAM in which the above problems of the prior art are mitigated.

SUMMARY OF THE INVENTION

In accordance with the present invention there is provided a self-timed RAM having a two-phase operating cycle clocked by a clock signal, the two-phase operating cycle having a precharge phase and a discharge phase, the self-timed RAM comprising:

control means for initiating and controlling the precharge phase followed by the discharge phase in response to a first transition of the clock signal; and logic means for determining when either phase of the two-phase operating cycle has not been completed before the next first transition of the clock signal and in response thereto for activating an error indicating means to indicate that an error may have occured during the RAM operating cycle.

The operating cycle may be a read or a write cycle.

It will be appreciated that an advantage of the present invention is that the timing of the precharge phase and discharge phase of each RAM operating cycle can be monitored so that any malfunctioning in any one cycle can be detected and signalled to the RAM control system.

Preferably, the control means is arranged to initiate the precharge phase in response to the first transition of the clock signal, and to provide to the logic means a discharge start signal when the precharge phase has been completed for initiating the discharge phase and a discharge complete signal when the discharge phase has been completed. The logic means is arranged to provide to the error indicating means a non-activating signal when the discharge complete signal is generated before the next first transition of the clock signal, whereby the error indicating means indicates that no error has occurred during the RAM operating cycle, and an activating signal when the next first transition of the clock signal occurs before the discharge start signal or the discharge complete signal is generated whereby the error indicating means indicates that an error may have occurred during the RAM operating cycle.

The logic means may comprise a first flip-flop such as a D-type flip-flop which is clocked in response to a first transition of the clock and is reset on receipt of the discharge complete signal. The first flip-flop after having first been reset on receipt of the discharge complete signal provides the non-activating signal in response to the next first transition of the clock signal and provides the activating signal in response to the next first transition of the clock signal when the first flip-flop has not first been reset.

The error indicating means may comprise a second flip-flop having an input coupled to receive the activating and non-activating signals from the first flip-flop, a reset input, and an error flag output, the error flag output being set in response to the activating signal and being reset in response to a signal provided on the reset input at the beginning of each operating cycle.

It will be appreciated that an advantage of the present invention is that if an error occurs during a sequence of write operations, on checking the error flag on completion of the write operation, the RAM controlling system will find the error flag set whereby the error flag is reset and the same write sequence repeated until the success of the write operation is signalled by a non-set error flag. If an error occurs during a sequence of read operations, the data stored in the RAM cannot be corrupted during the read operation and therefore, on completion of the operation, the RAM controlling system resets the error flag and repeats the operation until it is completed successfully and this will be indicated by a non-set error flag. Thus, the RAM control system can check for correct functioning of the self-timed RAM simply by checking the status of the error flag and without the need for verifying all memory locations. Such a technique provides an important advantage for systems which function in real-time.

BRIEF DESCRIPTION OF THE DRAWINGS

A preferred embodiment of the present invention will now be described with reference to the accompanying drawings in which.

DETAILED DESCRIPTION OF THE DRAWINGS

Figure 1:
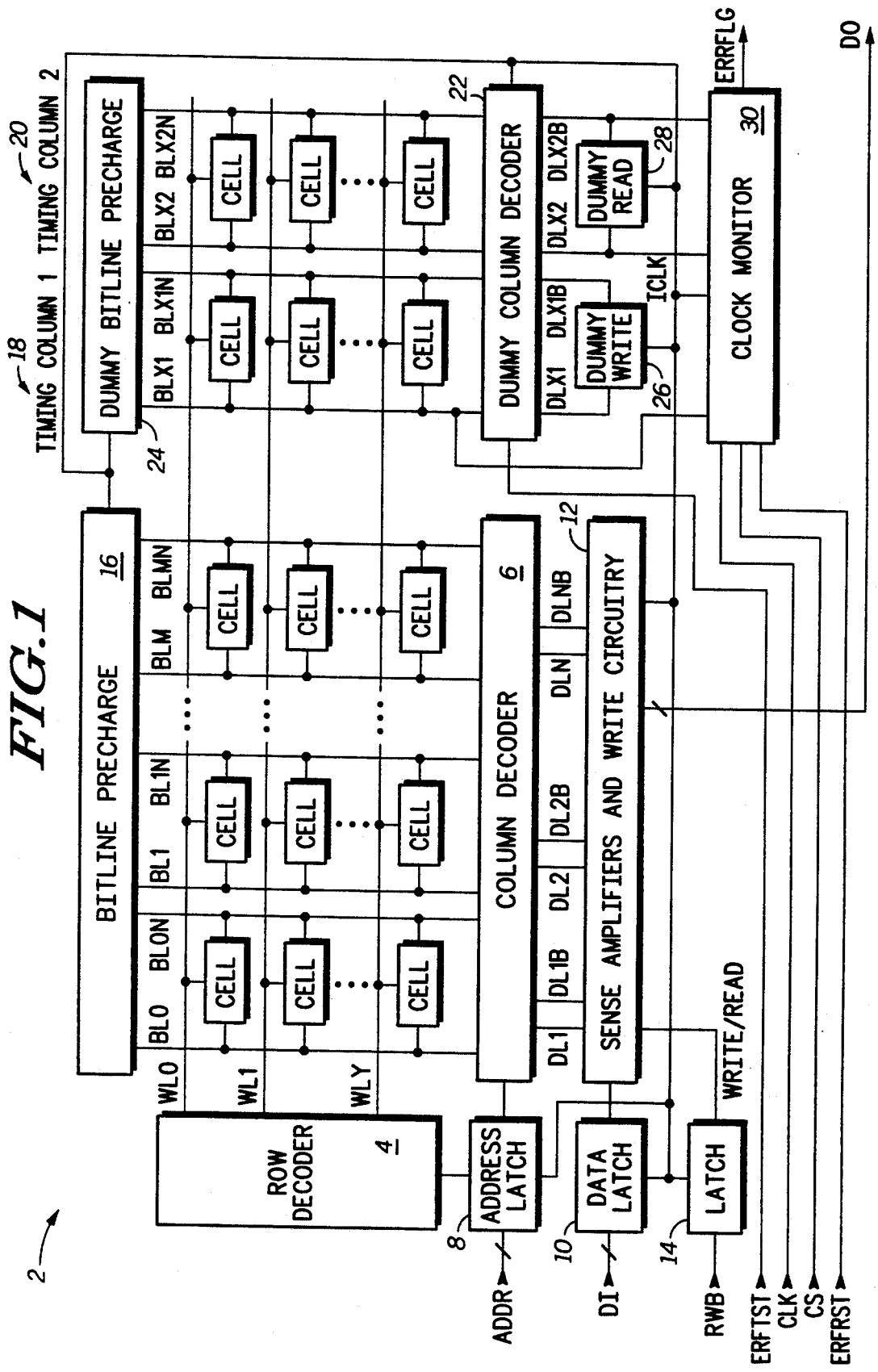
FIG. 1 shows a block schematic diagram of a self-timed RAM in accordance with the invention.

Referring firstly to FIG. 1, a self-timed RAM 2 comprises an array of cells arranged in m columns and y rows. Each row of cells is coupled to a row decoder 4 via respective row select lines WL0-WLy and each column of cells is coupled to a column decoder 6 via respective bit lines BL0, BL0N-BLm, BLmN. An address bus ADDR is coupled to the row decoder 4 and the column decoder 6 via address latch 8 and provides address signals to the decoders 4 and 6 to select predetermined cells in the array. A data bus DI provides data to a data latch 10 which is coupled to sense amplifier and write circuitry 12. The sense amplifier and write circuitry 12 is coupled to the column decoder via data lines DL1, DL1B-DLN, DLNB and has an output coupled to a data bus DO. A write/read latch 14, which is coupled to the sense amplifier and write circuitry 12, receives a write/read enable signal RWB. The self-timed RAM 2 is configured so that for a read cycle RWB is high and for a write cycle RWB is low.

Typically, each RAM cycle comprises two phases irrespective of whether it is a read operation or a write operation: a precharge phase and a discharge phase. These two phases are defined by an internal RAM clock signal ICLK. A bitline precharge circuitry 16 is coupled to the bit lines BL0, BL0N-BLm, BLmN. The precharge circuitry 16 in response to the internal clock signal ICLK precharges all the bit lines to a predetermined voltage during the precharge phase of the RAM cycle. Only those selected nodes in the array of cells are discharged during the discharge phase.

In order to add the self-timing function to the basic RAM described above, first and second dummy columns each having y core cells 18 and 20 are added as shown in FIG. 1. The first dummy column 18 is used to time the bit line precharge operation and the second dummy column 20 is used to time the bit line discharge operation. The precharge and discharge of the dummy columns are purposely slowed compared to the m+1 other columns to allow a design margin for reliable operation.

The cells of the first and second dummy columns 18 and 20 are coupled to row decoder 4 via row select lines WL0-WLy and a dummy column decoder 22 via bit lines BLX1, BLX1N and BLX2, BLX2N respectively. A dummy bitline precharge circuitry 24 is also coupled to the bit lines BLX1, BLX1N and BLX2, BLX2N of the first 18 and second 20 dummy column of cells respectively. Dummy write circuitry 26, which receives the internal clock signal ICLK, is coupled to the dummy column decoder 22 via data lines DLX1 and DLX1B. Dummy read circuitry 28 is coupled to the dummy column decoder 22 via data lines DLX2 and DLX2B.

The self-timed RAM 2 is arranged so that a logical '0' is always written, via the data lines DLX1 and DLX1B and the bit lines BLX1 and BLX1N, to the cell in the first dummy column 18 which is selected by the row decoder 4. The cells of the second dummy column 20 are assumed to contain random data i.e. either a logic '0' or a logic '1'. No write circuitry is necessary for the second dummy column 20 because the timing mechanism for the discharge operation does not depend on the data stored in the cells of the second dummy column. Furthermore, one of the bit lines BLX2 or BLX2B is always pulled low during the discharge phase of the RAM cycle, which one of these bit lines depends on the data in the cells. The dummy column decoder 22 ensures that the bit lines BLX1, BLX1N, BLX2, BLX2N of the first and second dummy columns 18 and 20 are connected to their corresponding data lines: that is, BLX1 to DLX1, BLX1N to DLX1B, BLX2 to DLX2 and BLX2N to DLX2B.

In accordance with a preferred embodiment of the invention, the self-timed RAM further comprises control logic 30 which monitors the state of the clock signal CLK. The control logic 30 indicates any abnormality in the timing by means of a RAM error flag ERRFLG. This will be described in more detail below. In addition to the clock signal CLK, the control logic 30 receives a chip select CS signal and a ERFRST signal. The control logic provides the RAM internal clock signal ICLK. The internal clock signal ICLK is received by the following elements: the bitline precharge circuitry 16, the dummy bitline precharge circuitry 24, the read/write latch 14, the input data latch 10, the address latch 8, the sense amplifier and write circuitry 12, the dummy column decoder 22, the dummy write circuitry 26 and the dummy read circuitry 28. The 'dummy' data lines DLX2 and DLX2B and bitline BLX1 are also coupled to the control logic 30. An ERFTST signal is coupled to the dummy column decoder 22.

Figure 2:
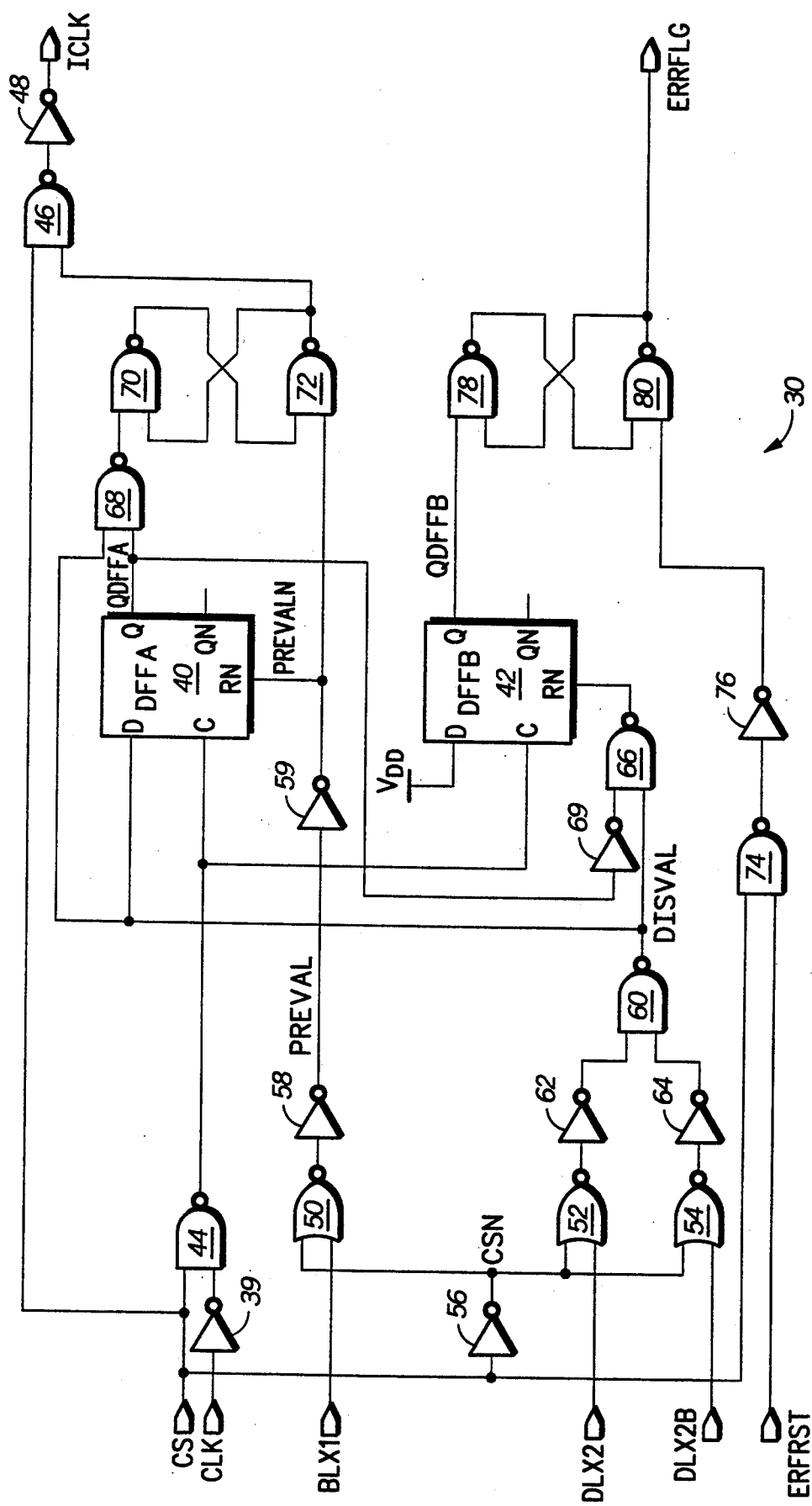
FIG. 2 shows a schematic diagram of control logic for the self-timed RAM of FIG. 1.

Referring now also to FIG. 2, the control logic 30 comprises a first D-type flip-flop 40 and a second D-type flip-flop 42. The data present on the D input of these first and second D-type flip-flops 40, 42 is transferred to the Q output in response to a rising edge on the C input i.e. the master to slave transfer occurs on the rising clock edge. The flip-flops are reset in response to a signal on the RN input. The operation of such flip-flops is well known in the art. It will be appreciated that the control logic 30 could be arranged so that the D-type flip-flop transfers data from the master to the slave on the falling edge of the clock C.

The chip select CS line is coupled to a first input of a NAND gate 44. The clock signal CLK is coupled to the input of an inverter 39. The output of the inverter 39 is coupled to a second input of the NAND gate 44. The output of NAND gate 44 is fed to the C input of the first and second D-type flip-flop 40 and 42 respectively. The first input of NAND gate 44 is also coupled to a first input of NAND gate 46 whose output is coupled to an inverter 48. The output of the inverter 48 provides the RAM internal clock signal ICLK. The first input of NAND gate 44 is also coupled to the first inputs of first 50, second 52, and third 54 NOR gates via an inverter 56.

The bit line BLX1 of the first dummy column 18 is coupled to a second input of the first NOR gate 50. The output of the first NOR gate 50 is inverted by inverter 58 to provide a precharge valid, PREVAL, signal which is fed to the reset input RN of the first D-type flip-flop via an inverter 59. The first D-type flip-flop 40 is reset when PREVAL goes high.

Data line DLX2 and data line DLX2B of the second dummy column 20 are coupled to second inputs of the second NOR gate 52 and the third NOR gate 54 respectively. The output of the second NOR gate 52 is fed to a first input of a NAND gate 60 via inverter 62. The output of the third NOR gate 54 is fed to a second input of NAND gate 60 via inverter 64. The output of NAND gate 60 provides a discharge valid, DISVAL, signal which is coupled to the D input of the first D-type flip-flop 40 and also to a first input of a NAND gate 66. The Q output QDFFA of the first D-type flip-flop 40 is fed via an inverter 69 to a second input of NAND gate 66. The output of NAND gate 66 is coupled to the reset input RN of the second D-type flip-flop 42. The second D-type flip-flop is reset when the signal at the RN input is low.

The first 50, second 52 and third 54 NOR gates are arranged so that when the voltage levels on their respective lines BLX1, DLX2 and DLX2B reach a first reference voltage level, the NOR gates switch output states and when the voltage levels on the respective lines drop below a second reference voltage level, the NOR gates switch back again.

The Q output QDFFA of the first D-type flip-flop 40 is coupled to a first input of a NAND gate 68. A second input of NAND gate 68 is coupled to receive the DISVAL signal from the output of NAND gate 60. The output of NAND gate 68 is coupled to a first input of a first NAND gate 70 of a pair of cross-coupled NAND gates 70 and 72. A first input of the second NAND gate 72 is coupled to receive the inverted PREVAL signal at the output of inverter 59. The output of the first NAND gate 70 is coupled to a second input of the second NAND gate 72 and the output of the second NAND gate 72 is coupled to a second input of the first NAND gate 70. The output of the second NAND gate 72 is also coupled to a second input of NAND gate 46.

The chip select line CS is also coupled to a first input of a NAND gate 74 and a error flag reset line ERFRST is coupled to a second input of NAND gate 74. The output of NAND gate 74 is fed via an inverter 76 to a first input of a first NOR gate 80 of a pair of cross-coupled NOR gates 80 and 78. The Q output QDFFB of the second D-type flip-flop 42 is coupled to a first input of the second NOR gate 78. The output of the first NOR gate 80 is coupled to a second input of the second NOR gate 78 and the output of the second NOR gate 78 is coupled to a second input of the first NOR gate 80. The output of the first NOR gate 80 provides the error flag signal ERRFLG. The D input of the second D-type flip-flop is coupled to the supply voltage $V_{DD}$ (typically, the RAM operates between 3-6 volts).

Figure 3:
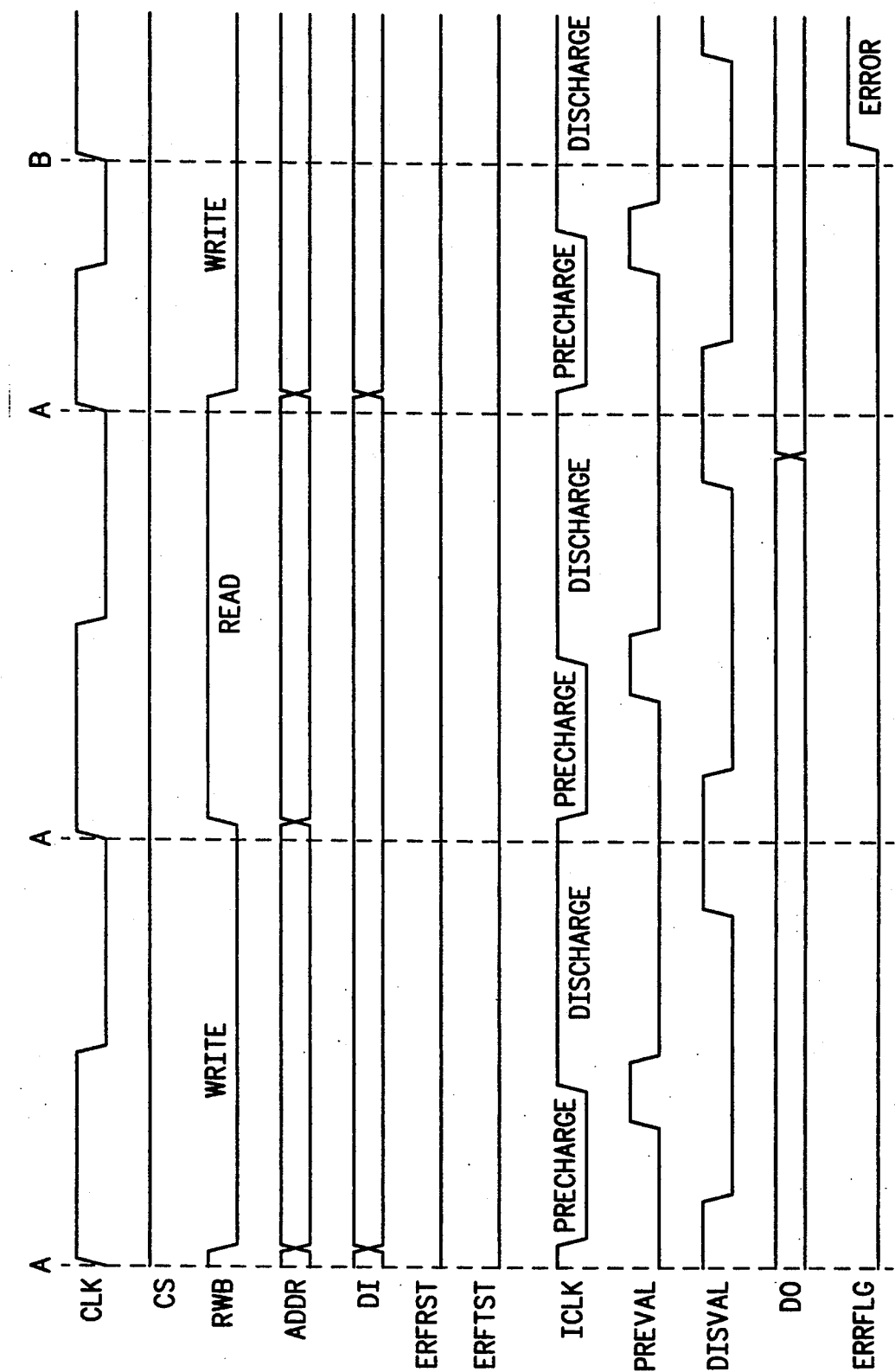
FIG. 3 shows a timing diagram for the self-timed RAM of FIG. 1.

The operation of the self-timed RAM 2 in accordance with the present invention will now be described with reference to FIGS. 1, 2 and 3. FIG. 3 shows a timing diagram for the self-timed RAM 2. The timing of the self-timed RAM 2 is identical in write and read modes and so the description that follows is appropriate for either modes of operation. In the following description reference is made to logic high and logic low which in the preferred embodiment correspond to logic '1' and logic '0' respectively.

The RAM is activated by pulling the chip select CS high while keeping the read mode enabled (RWB=high). Before a sequence of memory operations commence, the RAM error flag signal ERRFLG is reset to '0' by applying a pulse to error flag reset line ERFRST. The ERFRST signal is otherwise kept low. The RAM is then configured for a read or write operation depending on the signal on write/read line RWB. The other inputs, such as the address ADDR and data in DI, are supplied to satisfy set-up requirements.

Initially, the clock signal CLK is low, the bit line BLX1 of the first dummy column 18 is low and so the PREVAL signal is low. At the same time, one of the bit lines (either BLX2 or BLX2B) and its corresponding data line (either DLX2 or DLX2B) of the second dummy column 20 is low and hence the DISVAL signal is high.

The precharge operation is triggered by the rising edge of the clock signal CLK (at A on FIG. 3). The rising edge of the CLK signal causes the C input of the first D-type flip-flop 40 to go from low to high whereby the high DISVAL signal is transferred to the Q output QDFFA. The change in the Q output QDFFA of the first D-type flip-flop 40 from low to high causes the internal clock signal ICLK to go low. During the precharge phase, the bit lines and data lines of the first dummy column 18 are not connected together.

When the voltage on each of the data lines DLX2 and DLX2B is greater than the first reference voltage for a valid discharge, signal DISVAL goes low. When the voltage on bit line BLX1 is greater than the first reference voltage for a valid precharge, signal PREVAL goes high. The precharge of bit line BLX1 is purposely retarded slightly with respect to the precharge of all the other bit lines to allow an operating margin. When PREVAL goes high, the first D-type flip-flop 40 is reset. On resetting the first D-type flip-flop, the Q output QDFFA goes low since the DISVAL signal at the D input is low and ICLK goes high to start the discharge phase of the RAM cycle. Thus, the discharge phase of the RAM cycle occurs independently of the occurrence of the falling edge of the clock signal CLK.

All inputs to the RAM, such as RWB, ADDR and DI, are latched in write/read latch 14, data latch 10 and address latch 8 respectively to ensure that the levels of these signals do not change before the end of the current RAM cycle.

As the voltage on the bit line BLX1 drops below the second reference voltage for a valid precharge, PREVAL goes low. Concurrently, the voltage on only one of the bit lines BLX2 and BLX2N drops, causing in turn, the voltage on only one of the data lines DLX2 and DLX2B to drop. When the voltage on bit line DLX2 or DLX2B drops below the second reference voltage for a valid discharge, DISVAL goes high. The discharge of bit lines BLX2 or BLX2N (depending on the data stored in the accessed cell of the second dummy column 20), and consequently data line DLX2 or DLX2B, are purposely retarded slightly with respect to their counterparts in the RAM core to allow an operating margin. The output of the first D-type flip-flop 40 is still low and the output of inverter 69 is high. When DISVAL goes high, the current RAM cycle (whether it is write or read) has already been completed and the output of NAND gate 66 is forced low, resetting the second D-type flip-flop 42. Hence QDFFB remains low, the output of NOR gate 78 remains high and the error flag ERRFLG remains low signalling normal operation.

During the charge and discharge phase, the falling edge of the clock signal CLK has no effect on the control logic. However, if the next rising edge occurs before the discharge phase has been completed (at B on FIG. 3), that is before DISVAL goes high signalling the end of the RAM cycle, the Q output QDFFB of the second D-type flip-flop 42 changes from low to high: the rising clock edge causes the logic '1' at the D input to be transferred to the Q output QDFFB. Since QDFFB is high the output of the second NOR gate 78 will be low so that the output of the first NOR gate 80 will be pulled high causing the error flag to be set, that is ERRFLG=high. If the RAM cycle terminates before the advent of the rising edge of the clock CLK (at A on FIG. 3), that is DISVAL goes high before the rising edge of the clock CLK, a low signal is produced on the reset input RN of the second D-type flip-flop resetting the flip-flop so that the Q output QDFFB is prevented from going high. Since QDFFB does not go high the ERRFLG is not set to high.

If the error flag ERRFLG is found to be set high after a write operation or a sequence of write operations thereby indicating that the discharge phase has not been completed during the RAM cycle, it is likely that the data has not been correctly stored in the RAM. In this case, the error flag ERRFLG is reset by producing a pulse on the error flag reset line ERFRST and the write operation repeated. Thus, it will be appreciated that the invention provides a simple and quick way in which the integrity of the data written to the RAM cells can be verified by checking the status of the error flag ERRFLG without the need for verifying all the memory locations to check if they contain the correct data.

If the error flag ERRFLG is found to be set high after a read operation, then the data which has been read may not be correct. However, the data stored in the self-timed RAM remains uncorrupted since once the RAM cycle begins in response to a rising (or falling) clock edge, it terminates in its own time and no external influence can terminate the combined precharge/discharge cycle except when the power supply is disconnected. Thus, the system can resume normal operation when the interference on the clock and/or voltage supply lines disappears.

Since abnormal clock signals and varying supply voltages are difficult to generate during production tests, a separate test mode is provided to test the function of the logic responsible for setting the error flag ERRFLG. This test mode is initiated in response to the signal ERFTST coupled to the dummy column decoder 22. In normal operation, ERFTST is low, but if ERFTST is switched high at the beginning of the RAM cycle, the completion of the discharge phase is impeded whereby the error flag should be set high. Thus, the error flag logic can be tested.

All of the self-timed RAM inputs are gated with the chip select CS to ensure that direct current consumption in the standby mode CS=low is very low and only due to p-n junction leakage. For this reason, the inverter 39, which is a buffer for the clock signal, should not be powered by the power supply used for the RAM itself. This allows the self-timed RAM to be used for battery back-up applications.

The present invention has been described in relation to a self-timed RAM having two dummy columns. An advantage of using two columns is that since the RAM operates with two phases, it is quicker to have one column timing the precharge phase and the other column timing the discharge phase. However, it will be appreciated by those skilled in the art that the invention is not intended to be limited to such a two-column arrangement.

In summary, the present invention provides a self-timed RAM comprising control logic to monitor the state of the clock signal whereby any abnormality in the timing is signalled by means of a RAM error flag. The controlling system of the RAM can simply and quickly verify whether the read or write operation was successful by checking the status of the error flag. This is an important advantage in applications where the aim is to minimise the system cycle time. Thus, the invention prevents problems due to electrical noise, from for example clock frequency changes or drops in power supply voltage, from causing malfunctions in the operation of the self-timed RAM.

I claim:

1. A self-timed RAM having a two-phase operating cycle clocked by a clock signal, the two-phase operating cycle comprising a precharge phase and a discharge phase, the self-timed RAM comprising:
control means for initiating and controlling the precharge phase followed by the discharge phase in response to a first transistion of the clock signal, said control means being arranged to initiate the precharge phase in response to the first transition of the clock signal, and to provide a discharge start signal when the precharge phase has been completed for initiating the discharge phase and a discharge complete signal when the discharge phase has been completed; and
logic means for determining when either phase of the two-phase operating cycle has not been completed before a next first transition of the clock signal and in response thereto for activating an error indicating means to indicate that an error may have occurred during the RAM operating cycle, logic means comprising a first flip-flop which is clocked in response to the first transition of the clock signal and is reset on receipt of the discharge complete signal, whereby the first flip-flop after having first been reset on receipt of the discharge complete signal provides a non-activating signal in response to the next first transition of the clock signal and provides an activating signal in response to the next first transition of the clock signal when the first flip-flop has not first been reset, said logic means being arranged to provide to the error indicating means the non-activating signal when the discharge complete signal is generated before the next first transition of the clock signal, whereby the error indicating means indicates that no error has occurred during the RAM operating cycle, and the activating signal when the next first transition of the clock signal occurs before the discharge start signal or the discharge complete signal is generated whereby the error indicating means indicates that an error may have occurred during the RAM operating cycle.

2. A self-timed RAM according to claim 1 wherein the error indicating means comprises a second flip-flop having an input coupled to receive the activating and non-activating signals from the first flip-flop, a reset input, and an error flag output, said error flag output being set in response to the activating signal and being reset in response to a signal provided on the reset input at the beginning of each operating cycle.

3. A self-timed RAM according to claim 1 wherein the first flip-flop is a D-type flip-flop.

4. A self-timed RAM according to claim 3 further comprising an array of memory cells having a plurality of nodes prechargeable to a first predetermined voltage level in response to the first transition of the clock signal and selectively dischargeable to a second predetermined voltage level in response to a discharge start signal and wherein said control means comprises:
at least one dummy column of cells coupled to the array of cells, and having a plurality of nodes which are precharged to the first predetermined voltage level and selectively discharged to the second predetermined voltage level according to the precharging and discharging of the plurality of nodes of the array of memory cells; and
wherein the control means generates the discharge start signal when the voltage level at the nodes of the at least one dummy column of cells reaches the first predetermined voltage level and the discharge complete signal when the voltage level at a selected node of the at least one dummy column of cells reaches the second voltage level.

5. A self-timed RAM according to claim 4 wherein the control means comprises a first dummy column of cells and a second dummy column of cells coupled to the array of cells, and wherein the control means generates the discharge start signal when the voltage level at the nodes of the first dummy column of cells reaches the first predetermined voltage level and the discharge complete signal when the voltage level at a selected node of the second dummy column of cells reaches the second voltage level.

6. A self-timed RAM according to claim 4 wherein the control means comprises:
a first logic gate for providing a first output signal which is switchable from a first state to a second state when the voltage level of the plurality of nodes of the dummy column of cells reaches the first predetermined voltage level, the second state of the first output signal providing the discharge start signal; and
a second logic gate for providing a second output signal which is switchable from a first state to a second state when the voltage level of the selected node of the dummy column of cells reaches the second predetermined voltage level, the second state of the second output signal providing the discharge complete signal.

7. A method of indicating when an error may have occurred during an operating cycle of a self-timed RAM which is clocked by a clock signal and which comprises a precharge phase and a discharge phase, the method comprising the steps of:
initiating and controlling the precharge phase followed by the discharge phase in response to a first transition of the clock signal;
determining when either the precharge phase or discharge phase has not been completed before the next first transition of the clock signal; and
activating in response to the determining step an error indicating means to indicate that an error may have occurred during the self-timed RAM operating cycle.

8. A method according to claim 7 wherein the initiating and controlling step comprises the steps of:
initiating the precharge phase in response to the first transition of the clock signal;
generating a discharge start signal when the precharge phase has been completed for initiating the discharge phase;
generating a discharge complete signal when the discharge phase has been completed, and said determining step comprises the steps of:
providing a non-activating signal to the error indicating means when the discharge complete signal is generated before the next first transition of the clock signal whereby the error indicating means indicates that no error has occurred during the RAM operating cycle;
providing an activating signal to the error indicating means when the next first transition of the clock signal occurs before the discharge start signal or the discharge complete signal is generated whereby the error indicating means indicates that an error may have occurred during the RAM operating cycle.

9. A method according to claim 8 wherein the self-timed RAM comprises an array of memory cells and at least one dummy column of cells coupled to the array and wherein the precharge initiating step comprises precharging a plurality of nodes of the array and of the at least one dummy column to a first predetermined voltage level in response to the first transition of the clock signal,
the discharge start signal generating step comprises determining when the voltage level of the plurality of nodes of the at least one dummy column of cells reaches the first predetermined voltage level and generating the discharge start signal in response to the determining step whereby the plurality of nodes of the array and the at least one dummy column of cells are selectively discharged to a second predetermined voltage level,
the discharge complete signal generating step comprises determining when the voltage level of the selected nodes of the at least one dummy column of cells reaches the second predetermined voltage level and generating the discharge complete signal in response to the determining step.

10. A method according to claim 7 wherein the RAM operating cycle is either a read cycle or a write cycle.

* * * * *